United States Patent
Hiller et al.

[19]

[11] Patent Number: 5,915,754
[45] Date of Patent: Jun. 29, 1999

[54] METHOD OF MOUNTING AN ELECTRONIC POWER COMPONENT

[75] Inventors: Hans-Martin Hiller, Friedrichsdorf; Martin Stratmann, Frankfurt am Main; Wolfram Debus, Kronberg; Günter Oppermann, Dietzenbach; Friedrich Werhahn, Marktheidenfeld, all of Germany

[73] Assignee: Braun Aktiengesellschaft, Frankfurt, Germany

[21] Appl. No.: 08/652,381

[22] Filed: May 23, 1996

[30] Foreign Application Priority Data

Jun. 27, 1995 [DE] Germany .............................. 195 23 366
Sep. 8, 1995 [DE] Germany .............................. 195 33 251

[51] Int. Cl.$^6$ ..................................................... H05K 3/34
[52] U.S. Cl. .............................. 29/839; 29/840; 156/293; 228/175; 228/180.22; 361/688
[58] Field of Search .................. 29/840, 839; 228/123.1, 228/135, 175, 180.1, 180.22, 254; 156/293; 257/712, 713, 717; 361/688

[56] References Cited

U.S. PATENT DOCUMENTS

| | | |
|---|---|---|
| 3,825,803 | 7/1974 | Budde . |
| 3,900,153 | 8/1975 | Beerwerth et al. ................... 228/248.5 |
| 4,227,036 | 10/1980 | Fitzgerald . |
| 4,367,523 | 1/1983 | Urba . |
| 4,924,352 | 5/1990 | Septfons . |
| 4,939,570 | 7/1990 | Bickford et al. ......................... 257/713 |
| 4,999,699 | 3/1991 | Christie et al. .......................... 257/713 |
| 5,014,904 | 5/1991 | Morton . |
| 5,182,632 | 1/1993 | Bechtel et al. .......................... 257/713 |
| 5,359,768 | 11/1994 | Haley ........................................ 29/840 |

FOREIGN PATENT DOCUMENTS

| | | |
|---|---|---|
| 0 291 400 B1 | 5/1988 | European Pat. Off. . |
| 28 17 286 A1 | 9/1978 | Germany . |
| 31 47 789 A1 | 6/1983 | Germany . |
| A-41 02 265 A1 | 7/1992 | Germany . |
| 93 08 845 U1 U | 6/1993 | Germany . |
| A-42 04 391 A1 | 8/1993 | Germany . |
| 42 26 816 A1 | 2/1994 | Germany . |
| A-42 26 168 A1 | 2/1994 | Germany . |
| A-43 30 975 A1 | 3/1995 | Germany . |

OTHER PUBLICATIONS

Copy of European Search Report dated Apr. 15, 1997.

*Primary Examiner*—P. W. Echols
*Attorney, Agent, or Firm*—Fish & Richardson P.C.

[57] ABSTRACT

A method of mounting an electronic power component to a cooling element includes finishing at least a bonding area of the cooling element with a finish for use during soldering, forming an indentation in the bonding area of the cooling element, placing adhesive in the indentation, attaching the power component to the cooling element using the adhesive, and thereafter soldering the power component to the cooling element. The finishing melts during soldering and the adhesive prevents shifting of the power component on the cooling element during soldering. Alternatively, the power component is attached to a printed circuit board by adhesive bonding prior to soldering.

13 Claims, 3 Drawing Sheets

METHOD OF MOUNTING AN ELECTRONIC POWER COMPONENT

This invention relates to a method of mounting an electronic power component on a printed circuit board in a thermally conductive manner in combination with a cooling plate or a heat sink for the dissipation of heat, as well as a power component connected with a cooling plate or a heat sink.

A prior-art method is already known according to which surface-mount power semiconductors are directly bonded by an adhesive to a printed circuit board with plated through-holes and coated on both sides, the leads being subsequently electrically bonded by soldering. In this method, heat is conducted through the metallized bores beneath the power components to the underside of the printed circuit board where it is carried away. A heat sink is conventionally mounted at this location as by adhesive bonding, for the purpose of increasing the thermal capacity and the heat dissipating surface.

Further, a method is known in which an electronic power component as, for example, a diode, a transistor, a thyristor or a triac, is attached to a cooling plate. The attachment is performed, for example, by means of riveting, screw-threading, or by means of a clamping strap. The power component is connected to a cooling plate in order to remove the dissipation heat from the power component. Owing to the relatively large surface of the cooling plate, the capacity for removing heat is enhanced per unit of time as compared to arrangements in which the power component is not connected to a cooling plate. A thermally conductive connection between the power component and the cooling plate is accomplished by the use of a heat-conductive paste and mica plates. It is also known in the art to establish such a connection by soldering.

The problem underlying the present invention is that it is desirable to perform the thermally conductive mounting of a power component in the simplest possible manner.

According to the solution of the present invention, a surface-mount power component or another electronic power component can be mounted in a thermally conductive fashion and electrically bonded in an automatic manufacturing process with little effort. At the same time, the comparatively small thermal capacity of the copper-coated printed circuit board is increased, so that the amount of heat generated in operation of the power component can be carried away from the power component.

Present invention, a method of mounting an electronic power component on a cooling plate or heat sink in a thermally conductive manner includes soldering, the power component directly to the cooling element which may be a cooling plate or a heat sink. The advantage realized with the soldered connection of the power component with the cooling element is that this particular way of attaching the power component to the cooling element results in a particularly good heat transfer. This may be explained in that soldering provides a metallic connection between the power component and the cooling element, resulting in good heat transfer relation between the parts. Further, the flat soldering of the power component with the cooling element results in a large contact area. When mounting the power component on a printed circuit board, another advantage is that the soldered connection of the power component with the cooling element can be implemented with greater ease from the manufacturing point of view. Conventionally, low-power surface-mount components are placed on a printed board and soldered thereto in accordance with the circuit layout. If the thermally conductive connection between the power component and a cooling element is equally established by soldering, this represents a further integrated process in the method of manufacturing the complete printed circuit board. This has a particularly beneficial effect in the use of pick-and-place machines. The further soldering operation involves a simpler process than the processes hitherto applied for the thermally conductive mounting, because it can be combined with the electrical bonding in a single operation.

The characterizing features of the invention afford the advantage of enabling the electronic power component to be soldered to the cooling element with ease. The reliability of the soldered joint is thereby enhanced, and the effect of surface oxidation can be largely avoided. By applying a finish coat to only part of the cooling element, that is, to the portion where the electronic power component is attached to the cooling element, a further advantage realized is that the process of finishing the cooling element is possibly easier to implement. Because of its size, the cooling element has, overall, a relatively large thermal capacity. Accordingly, when the complete cooling element is dipped in a solder bath, it draws a relatively large amount of heat from this bath. To avoid any problems resulting therefrom, it will be advantageous to provide a finish on only that part of the cooling element to which the power component is to be soldered. As a result, a smaller portion of the cooling element is dipped in the solder bath, accordingly withdrawing only a reduced amount of heat. Finishing may be effected as by electroplating.

In further characterizing features of the invention, any problems that may occur in the manufacturing process during soldering as a result of finishing the surface of the cooling element are avoided. If finishing involved the process of tin-plating, for example, this finish reaches again its melting point as the power component is attached by means of soldering. Prior to soldering, the power component is fixed in place as by means of one or several drops of adhesive, as is known and conventional practice in the placement of surface-mount components. Fusing the finish thus involves melting of the base of the adhesive. This thus cancels the fixed location of the power component, involving the risk of the power component shifting, that is, floating away. By center-punching the upper side of the cooling element, that is, the power component attachment side, prior to mounting the component, the finish-coat will be urged out of the indentation produced by center-punching. The bare material of the cooling element is thus exposed. When the adhesive is then inserted into the indentations produced by the punch mark, the lack of finish-coat in the indentation ensures that on fusing the tin-plating the adhesive adheres at least to those locations where there is no finish. As a result, the base of the adhesive will not be subject to fusing at these locations, so that the power component is securely fixed in place also in cases where the finish is fused during the soldering operation.

It is advantageously ensured that the power component is fixed in place during soldering and is prevented from "floating away" as a result of liquefaction of the finish-coat of the cooling element. By relocating the power component in the direction of the printed circuit board and adhesively bonding it to an edge of the printed circuit board—advantageously in the area of the leads of the power component—the power component provides a type of bridge connecting the printed circuit board with the cooling element. This arrangement has the advantage that the complete metallization surface of the power component is available for heat dissipation in operation, without any surface area being required from the metallization surface for the adhesive bonding on the cooling element. The heat transfer from the power component to the cooling element is thereby further optimized.

A defined distance is maintained during the soldering operation between the power component and the cooling element, such as to afford ease of introduction of the solder. As a result of the relative distance of the power component to the cooling element, capillary action causes the liquid solder to be drawn into the space between the power component and the cooling element. The relative distance is advantageously determined such as to obtain an optimum capillary effect for the liquid solder between the power component and the cooling element. This thus results in a particularly good flat soldering of the power component to the cooling element, while at the same time the solder can be readily applied from at least one side.

The invention produces the advantageous result that in the event of automatic placement all of the components, including the electronic power component, are positioned in a level line. This facilitates component placement using a pick-and-place machine. Further, due to the fact that all of the components are level with each other, it is easily possible, during soldering for establishing the electrical bond, to solder the electronic power component(s) for attachment in a thermally conductive relationship, without the need for an elaborate adjustment of the soldering device. In this arrangement, the cooling element is disposed at least partially in a cutout of the printed circuit board or adjoins the printed circuit board, being in a way an "appendix" of the printed circuit board. This requires the cooling element to be appropriately bent, such that the portion of the cooling element by means of which the cooling element is attached to the printed circuit board is beneath the printed circuit board. In the area of the cutout of the printed circuit board, the cooling element has a raised portion at least at the place of attachment of the power component, so that at this location the cooling element surface is level with the printed circuit board surface.

The materials of which this cooling element is made exhibit a very good thermal conductivity. This ensures a particularly good heat transfer following soldering.

Particular ease of soldering the power component to the cooling element is ensured by preheating the cooling element.

The cooling element mounts on the printed circuit board with ease. When the mounting lugs of the cooling element are first inserted through the holes in the printed circuit board and folded over, this facilitates the manufacturing process as compared to other known fastening methods as, for example, screw-threading or riveting.

It is particularly advantageous that thermal expansions of the cooling element as well as of the power component due to the dissipation heat generated in the power component cause, at most, minor mechanical strains of the cooling element and the power component. By reason of the fact that the power component and the cooling element are attached as on one side only, such thermal expansions are free to extend in the other directions, without causing damage to mechanical or electrical connections with the printed circuit board.

Advantageously, an outwardly extending terminal of the power component may be omitted. This makes it easier to maintain a minimum distance between the remaining terminals. For example, the possibility exists to couple the power component through the cooling element to an electrical potential of the printed circuit board by soldering.

Inspection of the soldered connection is possible with particular ease. Inspection can be performed through the hole in the cooling element which is provided at a location remote from the side where the solder is applied. Solder is in a position to escape through this hole only if the area between the power component and the cooling element is filled with solder at least up to this hole. It has proven to be particularly advantageous in this method to apply the finish-coat also to the cylindrical inner surface of the hole. This makes it particularly easy for the solder to pass through the hole when the liquid solder has come up to this hole during soldering.

Where space is limited on the printed circuit board, the invention enables a cooling element of a specified size to be used without the cooling element using up an inordinate amount of space for itself. By bending the cooling element, it is possible to obtain a size suitable for ensuring a sufficiently large thermal capacity and a sufficiently large heat dissipating surface.

An embodiment of the present invention is illustrated in the accompanying drawings. In the drawings, FIG. 1 shows how an electronic power component is soldered to a cooling element;

Figure 1:
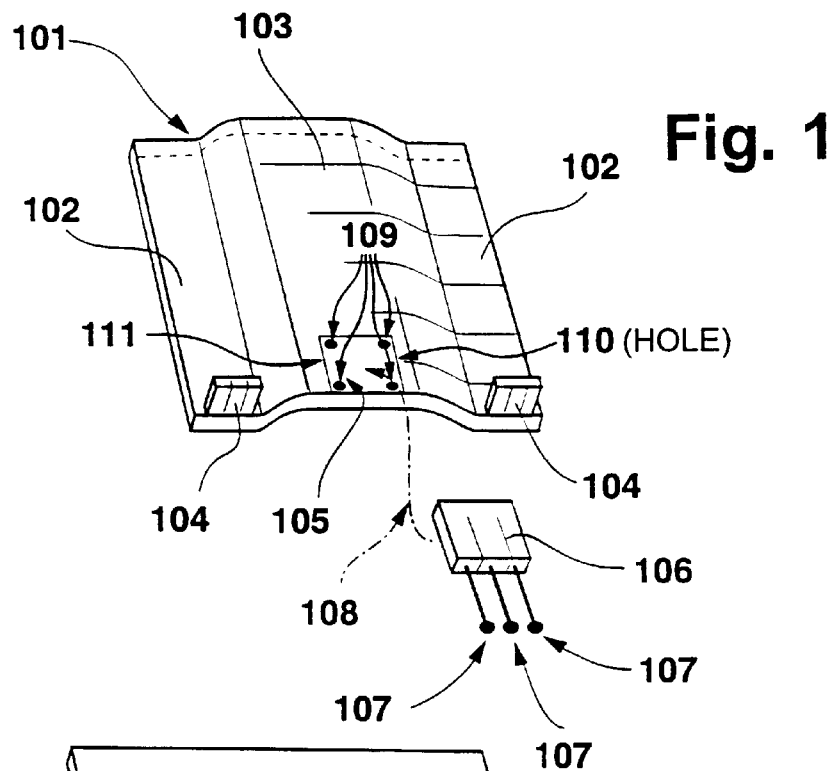

FIG. 1 shows a cooling element 101 which may be a cooling plate or a heat sink. In the following embodiment, the invention will be described with reference to a cooling plate. It will be understood that, rather than using a cooling plate, a heat sink with a different geometrical configuration and/or fabricated from a different material may also find application. The cooling plate of this embodiment includes two outer areas 102 as well as a mid-area 103 which is raised relative to the outer areas 102. Disposed in either area 102 is a mounting lug 104 extending vertically upwardly from the surface of the cooling plate. The cooling plate has a further area 105 to which the power component 106 is soldered. Arrow 108 indicates that this power component is soldered to this particular area. The power component 106 is provided with electrical leads 107. By soldering the power component to the cooling plate 101, a metallic connection is established between the power component 106 and the cooling plate 101. This results in a highly efficient heat transfer and thus a very good dissipation of the heat generated in the power component. A particularly good heat removal is realized if the cooling plate 101 is made of copper, brass, tinplate, processed aluminum, or the like. Soldering is a particularly simple procedure when the cooling plate 101 is finished as by tin-plating, for example. Other kinds of finishes may include a coating of silver, gold, nickel, palladium and/or special enamels. Advantageously, the finish-coat is only applied to area 105 to which the power component 106 is to be soldered. Due to the relatively large thermal capacity of the cooling plate as a whole, applying the finish-coat to the complete cooling plate would withdraw an excessive amount of heat from the solder bath. By finishing only the area 105, the demands placed on temperature control during soldering the cooling plate are lower. Further, soldering can be performed with particular ease if the cooling plate 101 is in a preheated condition at the time of soldering.

Further, it has proven to be particularly advantageous to provide spacers 109 for maintaining a defined distance between the power component 106 and the cooling plate 101 during soldering. These spacers 109 may be fitted prior to the soldering operation. Another implementation possibility includes the provision of embossments on the underside of the cooling plate 101 at the corresponding locations of the spacers 109, with the resulting deformation of the material of the cooling plate 101 then producing the spacers 109 on the upper side at the appropriate locations. Alternatively, these spacers may also be provided on the power component 106. During soldering, the spacers ensure a defined distance between the power component 106 and the cooling plate 101. Advantageously, this defined relative distance is of the order of magnitude of up to one millimeter and serves the function of drawing the solder, by capillary action, into the space maintained between the cooling plate 101 and the power component 106 during soldering. In the embodiment of FIG. 1, the solder is applied from the side 111 into the space between the cooling plate 101 and the power component 106. Instead of or in addition to applying the solder from the side 111, it is of course also possible to apply it from another side. As becomes further apparent from the embodiment of FIG. 1, a hole 110 is provided in that portion of the cooling plate 101 to which the power component 106 is soldered and which lies opposite the side 111 from which the solder is applied. This hole 110 is thus at a maximum possible relative distance to the side 111. Advantageously, this hole 110 is finish-coated like the area 105. This hole 110 affords an easy way of inspecting the soldering. For heat removal, it is essential that the soldering be flat. The soldering can be checked through the hole 110 because the solder is in a position to rise in the hole 110 only if the solder was drawn flat into the space between the power component 106 and the cooling plate 101. This check may be performed by visual inspection or, alternatively, electrically by means of a probe. If the solder is applied between the power component 106 and the cooling plate 101 from several sides, it will be advantageous to suitably change the position of the hole 110 as by relocating it towards the center of the surface of the cooling plate 101 to which the power component 106 is attached. This enables again the quality of the flat soldering to be inspected through a correspondingly larger distance relative to the corresponding sides. The provision of several holes 110 in the cooling plate may be also contemplated.

For efficient assembly, it will be appropriate to attach first the cooling plate to the printed circuit board. In this method, the cooling plate is moved up to the printed circuit board 201 such that the mounting lugs 104 are passed through the holes 202 in the printed circuit board 201. The area 103 that is raised relative to the two areas 102 of the cooling plate 101 is then flush with the window 204 in the printed circuit board. It is thereby ensured that when the components are subsequently mounted the power component is positioned on a level with the remaining components. The cooling plate is secured in place such that the mounting lugs 104 are folded over at their ends protruding from the holes 202. Such folding over provides at least a first mechanical fastening of the cooling plate 101 together with the power component 106 to the printed circuit board.

The next operation involves mounting the power component as required by the assembly plan. In the use of surface-mount technology, the surface-mount power component is first fixed in the place appropriate for soldering by means of a surface-mount adhesive.

In cases where a tinplate finish was selected for the cooling plate surface, a difficulty may arise in that the instant the tin-plating is fused during soldering, the base with the surface-mount adhesive and the power component floats away, thus shifting the power component from its position. To prevent this undesired effect from occurring, the location on the cooling plate where the surface-mount adhesive is to be applied is center-punched in a prior operation, causing the tinned surface to be displaced such as to expose the tin-free base material in the conical inner surface of the punch mark. Center-punching is thus done from the upper side of the area 105. It is to this position of the tin-free punch mark(s) that the surface-mount adhesive is applied upon attachment of the cooling plate to the board.

As an alternative to the assembly sequence referred to in the foregoing, it is also possible to first solder the power component to the cooling plate. Subsequent to this operation, the cooling plate, in combination with the power component, is mounted on the board in the manner previously identified.

Figure 4:
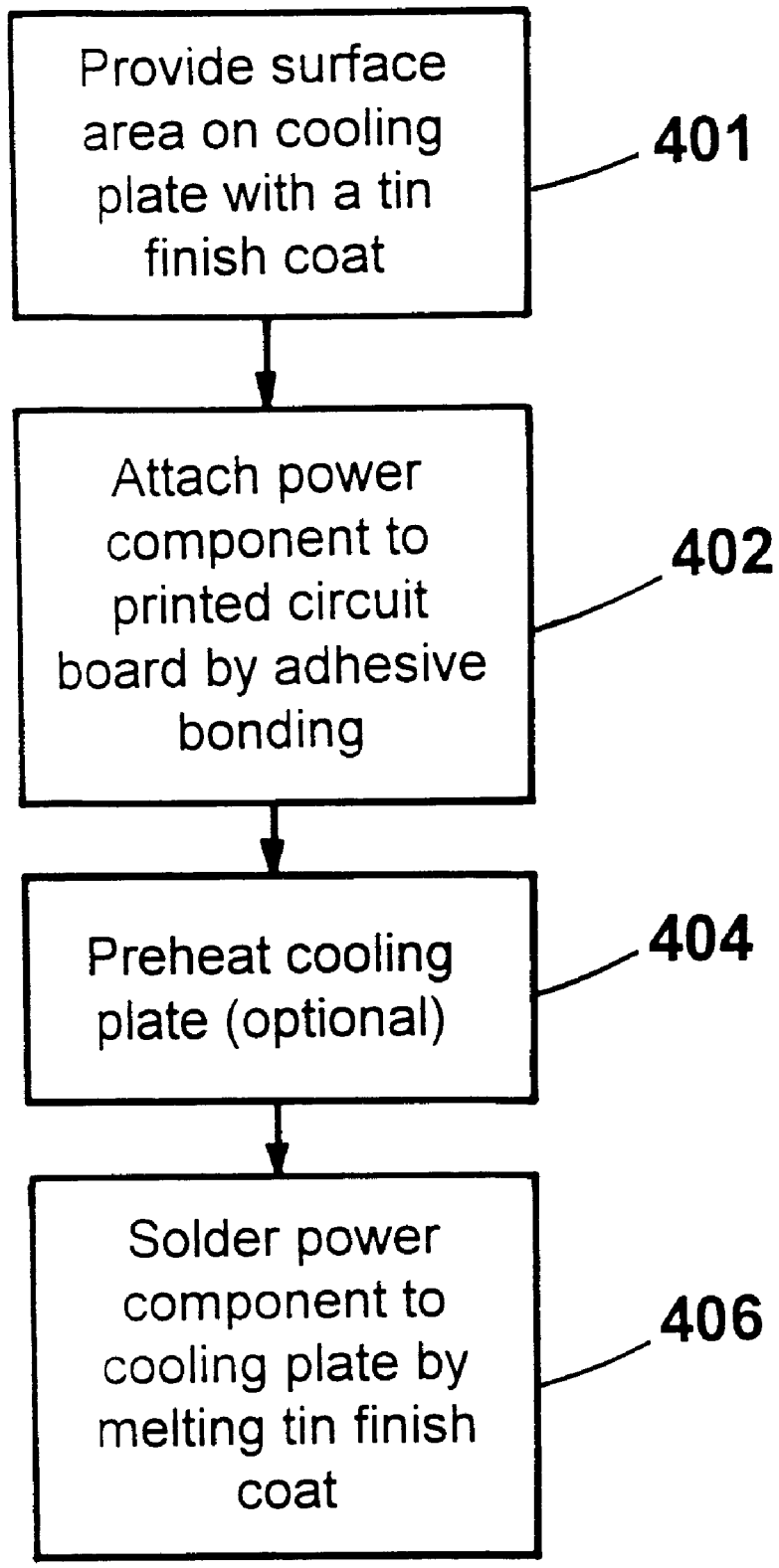
FIG. 4 shows a block diagram of the soldering process.

Referring now to FIG. 4, in another alternative solution, it is also possible to dispose the power component 106 in an offset position in the direction of the printed circuit board. Conveniently, the power component 106 is bonded to the printed circuit board by an adhesive prior to soldering (step 402). In this manner, the power component 106 is secured at its current position in the event that the finish coat that was previously applied to the cooling element (step 401) melts during soldering (step 406). It is an advantage in this solution that the complete metallization surface of the power component is soldered to the cooling plate 101 without part of this metallization surface being required for adhesive bonding. It will thus be seen that a particularly good heat transfer is thereby accomplished. Before the power component is soldered to the cooling plate, the cooling plate can be preheated (step 404).

With surface-mount components, it is an advantage that only a single operation is necessary during soldering. This means that all of the components of this board are electrically bonded in a single operation together with the thermally conductive mounting of the power component(s) 106.

The power component 106 soldered to the area 105 is thus in a raised position relative to the printed circuit board 201. The electrical leads 107 are soldered to the points 203 on the printed circuit board 201 provided for this purpose. Advantageously, the folded-over mounting lugs 104 are also soldered to the printed circuit board 201, resulting in a particularly firm mechanical connection. In this soldering, it is also possible to couple the cooling plate 101 to an electrical potential of the printed circuit board 201. In a particularly advantageous manner, an outwardly extending lead of the power component may be omitted if this electrical lead is then coupled to the corresponding electrical potential of the printed circuit board 201 through the thermally conductive mounting on the electrically conductive cooling plate 101 through the mounting lugs 104 together with the soldered joint. In the use of surface-mount technology, the soldering process sequence described in this paragraph may then be implemented equally in the same operation together with the electrical bonding of the remaining components.

Further, the mounting lugs 104 are advantageously provided directly in the area 105 to which the power component 106 is soldered. As a result, the fastening means of the cooling plate together with the power component 106, which include a connection to the printed circuit board, are all on the same side. Accordingly, when the power component generates dissipation heat, causing the cooling plate and the power component to be heated and expand in the process, mechanical stresses are prevented from coming to bear due to this floating mounting of the cooling plate together with the power component on the printed circuit board. The cooling plate is thus free to expand in those areas in which the cooling plate is not suspended.

Figure 2:
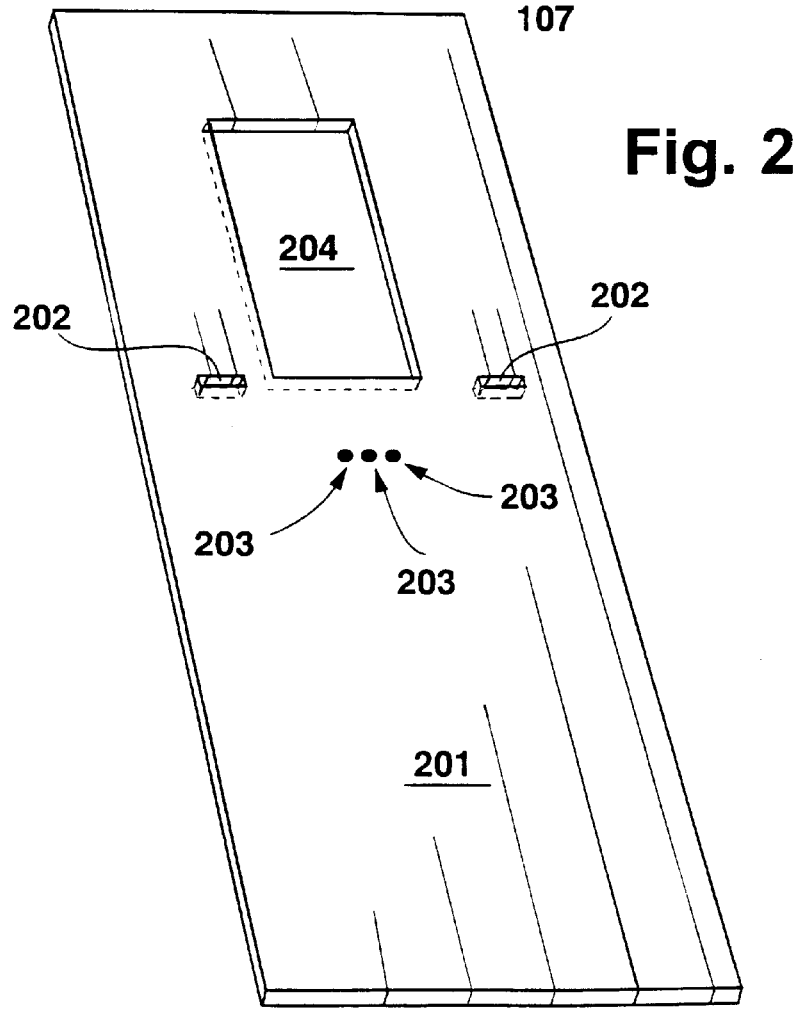
FIG. 2 shows how the cooling element including the power component are attached to a printed circuit board.

The sequence of assembly operations has been described with reference to FIGS. 1 and 2 to make it clear how the finished product looks like. In a practical implementation, however, it will be more efficient to mount first the cooling plate on the board and then, as the surface-mount components are added, solder not only the leads but establish at the same time the thermally conductive mounting of the power components on the cooling plate by soldering.

Figure 3:
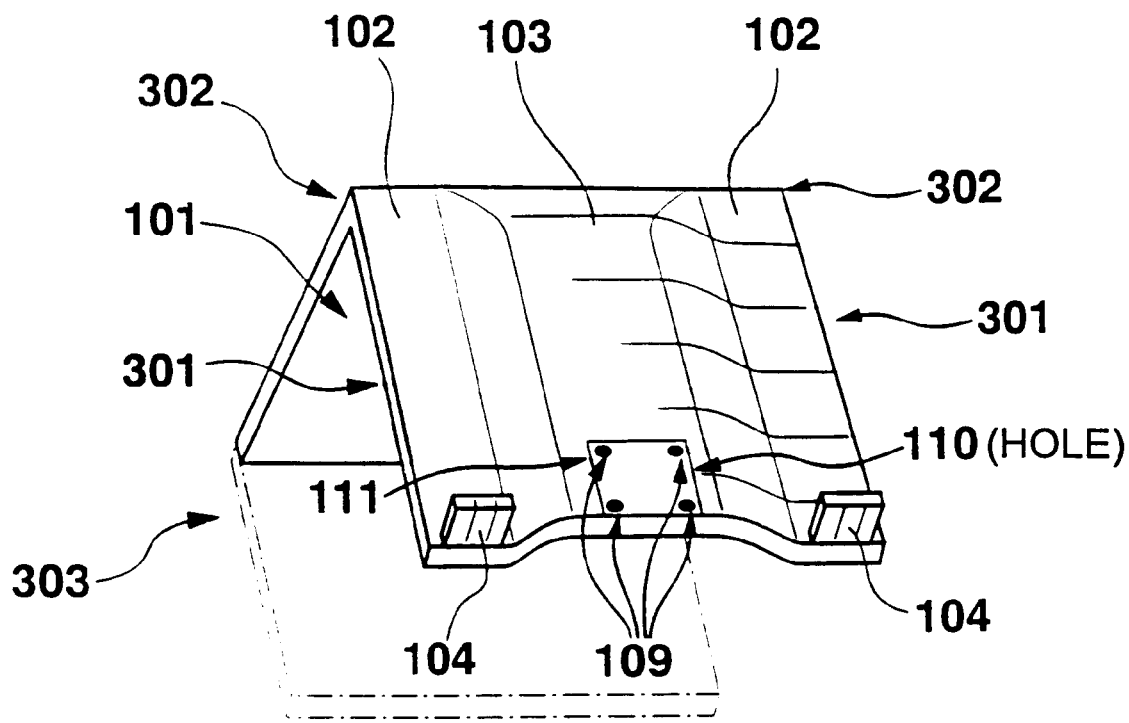
FIG. 3 shows an alternative embodiment of a cooling element.

FIG. 3 shows a further embodiment of the cooling plate. In FIG. 3, like parts are assigned like reference numerals as in FIG. 1. In the cooling plate of FIG. 3, the space occupied by the raised area 103 is limited. Starting from a line 301, the raised area 103 extends such as to be level with the area 102 up to a line 302. The possibility also exists to have the raised area 103 extend continuously on a level with the area 102. The cooling plate 101 is then bent along the line 302. As becomes further apparent from the embodiment of FIG. 3, a further bend 303 is provided. While maintaining a certain size and an attendant sufficiently large thermal capacity and heat dissipating surface, it is thereby possible to limit the cooling plate space requirements on the printed circuit board. By bending the cooling plate as appropriate, it is possible to adapt the cooling plate to the spaces available on the printed circuit board and in the apparatus into which the board is to be inserted.

We claim:

1. A method of mounting an electronic power component to a cooling element, comprising:
   finishing at least a bonding area of said cooling element with a finish coat for use during soldering;
   attaching said power component to a printed circuit board by adhesive bonding; and thereafter
   soldering said power component to said cooling element, wherein said finish coat melts during soldering and said adhesive prevents shifting of said power component on said cooling element during soldering.

2. The method of claim 1 wherein said finishing includes coating with a material selected from the group consisting of tin, gold, silver, nickel, palladium, tin-containing alloys, and enamel.

3. The method of claim 1 wherein said soldering includes providing at least one spacer between the cooling element and the power component.

4. The method of claim 1 wherein a material from which said cooling element is formed is selected from the group consisting of copper, brass, tinplate, and processed aluminum.

5. The method of claim 1 further including heating said cooling element prior to soldering.

6. The method of claim 1 further including attaching said cooling element to said printed circuit board.

7. The method of claim 6 wherein attaching said cooling element to said printed circuit board includes aligning said bonding area to be level with a component side of said printed circuit board.

8. The method of claim 7 wherein said aligning includes providing said cooling element with a raised area which sits within a cut-out in said printed circuit board.

9. The method of claim 6 wherein said attaching of said cooling element to said printed circuit board includes inserting mounting lugs of the cooling element through matching holes in said printed circuit board and folding over said mounting lugs.

10. The method of claim 9 further including soldering said mounting lugs to the printed circuit board following folding over.

11. The method of claim 10 wherein said soldering of said power component to said cooling element establishes an electrical connection between said power component and said cooling element, and said soldering of said mounting lugs to said printed circuit board couples said cooling element to an electrical potential of said printed circuit board.

12. The method of claim 1 further including providing at least one hole in said cooling element in said bonding area.

13. The method of claim 1 further including providing said cooling element in a c-shaped configuration.

* * * * *